(12) United States Patent
Nalla et al.

(10) Patent No.: US 9,769,398 B2
(45) Date of Patent: Sep. 19, 2017

(54) IMAGE SENSOR WITH LARGE-AREA GLOBAL SHUTTER CONTACT

(71) Applicant: Microsoft Technology Licensing, LLC, Redmond, WA (US)

(72) Inventors: Ravi Kiran Nalla, San Jose, CA (US); Raymond Kirk Price, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 51 days.

(21) Appl. No.: 14/989,091

(22) Filed: Jan. 6, 2016

(65) Prior Publication Data

US 2017/0195588 A1    Jul. 6, 2017

(51) Int. Cl.
*H04N 5/353* (2011.01)
*H04N 5/372* (2011.01)

(52) U.S. Cl.
CPC ............ *H04N 5/353* (2013.01); *H04N 5/372* (2013.01)

(58) Field of Classification Search
CPC .............................. H04N 5/353; H04N 5/2353
See application file for complete search history.

(56) References Cited

U.S. PATENT DOCUMENTS

| | | | |
|---|---|---|---|
| 6,168,965 B1 | 1/2001 | Malinovich et al. | |
| 7,435,620 B2 | 10/2008 | Benson et al. | |
| 7,589,390 B2 | 9/2009 | Yao | |
| 7,679,167 B2 | 3/2010 | Chen et al. | |
| 7,994,598 B2 | 8/2011 | Weng et al. | |
| 8,334,498 B2* | 12/2012 | Kanbe | H01L 27/14609 250/208.1 |
| 8,497,483 B2 | 7/2013 | Puhakka et al. | |
| 8,508,039 B1 | 8/2013 | Nasiri et al. | |
| 9,324,746 B2* | 4/2016 | Choi | H01L 27/14612 |
| 2008/0100910 A1 | 5/2008 | Kim et al. | |
| 2008/0173792 A1 | 7/2008 | Yang et al. | |
| 2008/0191335 A1 | 8/2008 | Yang et al. | |
| 2008/0290438 A1 | 11/2008 | Weng et al. | |
| 2010/0194959 A1* | 8/2010 | Kanbe | H04N 5/3728 348/311 |
| 2012/0109575 A1 | 5/2012 | Balbus et al. | |
| 2014/0043513 A1 | 2/2014 | Lee et al. | |
| 2014/0055654 A1 | 2/2014 | Borthakur et al. | |
| 2015/0084098 A1* | 3/2015 | Choi | H01L 27/14612 257/230 |

OTHER PUBLICATIONS

Solberg, Vern, "Implementing Tsv for 3d Semiconductor Packaging", In Proceedings of Surface Mount Technology Association, Sep. 27, 2015, 6 pages.

* cited by examiner

*Primary Examiner* — Nicholas Giles
(74) *Attorney, Agent, or Firm* — Perkins Coie LLP (57) ABSTRACT

An image sensor comprising a substrate that includes a plurality of photodiodes and a shutter trigger contact is disclosed. The plurality of photodiodes collectively define at least part of a pixel area parallel to a surface of the substrate. The shutter trigger contact is coupled to provide a common shutter trigger signal to the plurality of photodiodes and includes a contiguous conductive region disposed on the substrate substantially coextensively with the pixel area.

20 Claims, 5 Drawing Sheets

FIG. 7A     FIG. 7B

IMAGE SENSOR WITH LARGE-AREA GLOBAL SHUTTER CONTACT

BACKGROUND

Charge-coupled devices (CCDs) and complementary metal-oxide-semiconductor (CMOS) devices are commonly used as image sensors in digital imaging devices such as digital cameras. A CCD or CMOS image sensor typically includes a matrix of pixels, where each pixel includes a photodiode formed by a doped region of semiconductor in a semiconductor substrate, and a gate electrode. The photodiode collects the charge produced by the incident light around the biased gate electrode. A mechanical or electronic shutter function is used to start and stop charge accumulation in the pixels. Voltage or current values representing the accumulated charges are then shifted off the pixel array, amplified and processed to produce data representing an image.

An important factor in the design of an image sensors requiring precise global shuttering for time of flight sensors or high speed cameras requires precisely-matched signal propagation delay. Signal propagation delays that are too long or that are unequal through the sensor can adversely affect performance of the sensor. Another important factor is low resistivity contact between the electronic gating signal and the gated. A CCD or CMOS image sensor is typically made of multiple layers, including one or more semiconductor layers, one or more insulation layers and one or more conductive layers. Poor electrical contact between certain layers can cause poor performance of the device.

SUMMARY

The technique introduced here includes an image sensor comprising a substrate that includes a plurality of photodetector regions (e.g., photodiodes) and a shutter trigger contact. The plurality of photodetector regions collectively define at least part of a pixel area parallel to a surface of the substrate. The shutter trigger contact is coupled to provide a common "global" shutter trigger signal to the plurality of photodetector regions and includes a contiguous conductive region disposed on the substrate so as to be substantially coextensive with the pixel area.

In certain embodiments, the image sensor includes at least 25,000 photodiodes (e.g., a 160×160 matrix of photodiodes/pixels), and the contiguous conductive region is disposed on the substrate so that the minimum distance between the shutter trigger contact and each of the at least 25,000 photodiodes is substantially equal.

Other aspects of the technique will be apparent from the accompanying figures and detailed description.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

One or more embodiments of the present disclosure are illustrated by way of example and not limitation in the figures of the accompanying drawings, in which like references indicate similar elements.

Note that these figures are not drawn to scale.

DETAILED DESCRIPTION

In this description, references to "an embodiment", "one embodiment" or the like, mean that the particular feature, function, structure or characteristic being described is included in at least one embodiment of the technique introduced here. Occurrences of such phrases in this specification do not necessarily all refer to the same embodiment. On the other hand, the embodiments referred to also are not necessarily mutually exclusive.

Note that while the present description focuses on CCD image sensors to facilitate description, the techniques introduced here can also be applied to other types of image sensors, such as CMOS image sensors. Additionally, the techniques introduced here can be applied to either front side illuminated (FSI) image sensors or backside illuminated (BSI) image sensors, as discussed further below.

Figure 1A:
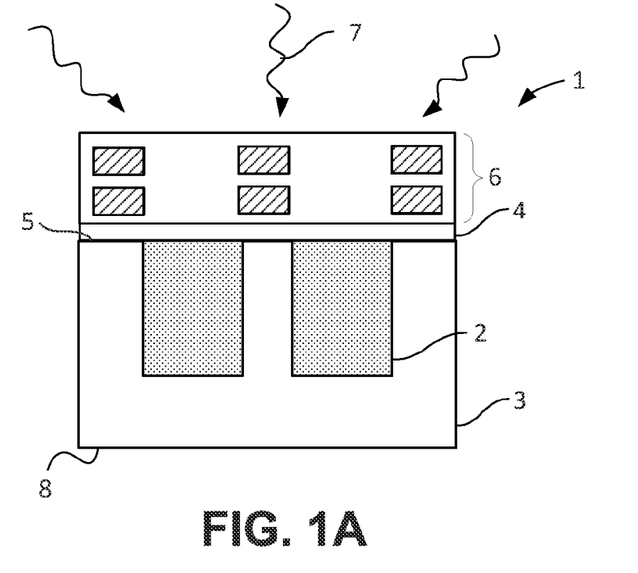
FIG. 1A shows a simplified cross-sectional view of a conventional front side illuminated (FSI) CCD image sensor.
Figure 1B:
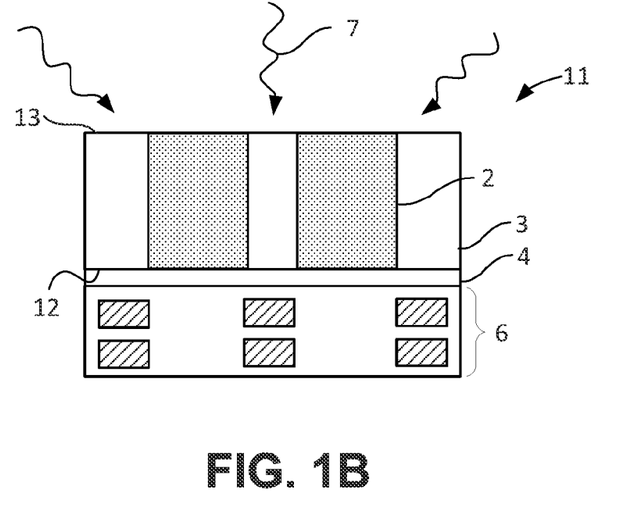
FIG. 1B shows a simplified cross-sectional view of a conventional back side illuminated (BSI) CCD image sensor.

FIGS. 1A and 1B show simplified cross-sectional views of conventional FSI CCD image sensors. More specifically, FIG. 1A shows a conventional FSI CCD image sensor 1, while FIG. 1B shows a conventional BSI CCD image sensor 11. In either type of sensor, active regions 2 are formed in a semiconductor substrate 3 to form photodiodes, where each photodiode forms a separate pixel in a two-dimensional matrix of pixels. In the FSI sensor 1 (FIG. 1A), an oxide layer 4 (e.g., silicon dioxide) is formed on a surface 5 of the substrate 3, and one or more conductive routing layers 6 are formed over the oxide layer 4 to provide the input/output (I/O) contacts to the photodiodes. Surface 5 is referred to as the "front side" or "front surface" of the substrate 3 and is the surface at which light 7 from an imaging light source is incident upon the substrate 3 (thereby giving the structure its classification of "front side illuminated"). Surface 8, on the other hand, is referred to as the "back side" or "back surface" of the substrate 3.

In the BSI sensor (FIG. 1B) 11, the oxide layer 4 is formed on the bottom surface 12 of the substrate, and the conductive routing layer(s) 6 is/are formed on the oxide layer 4. In the BSI sensor (FIG. 1B) 11, bottom surface 12 is referred to as the "front side" or "front surface" of the substrate 3, whereas top surface 13, at which light 7 from an imaging light source is incident upon the substrate 3, is referred to as the "back side" or "back surface" of the substrate 3.

Certain imaging applications may require a CCD image sensor with a very fast shutter function (i.e., a shutter function with nanosecond or picosecond accuracy and repeatability), and may therefore require an electronic shutter rather than a mechanical shutter. An electronic shutter signal applied to all pixels on the sensor simultaneously is called a "global shutter." Some imaging applications may utilize a globally shuttered CCD image sensor driven by using pins on the top side of the device that are wire-bonded onto a printed circuit board (PCB). Conventional globally shuttered CCD image sensors connect the global shutter trigger signal (also called "global shutter signal" or simply "global shutter" herein) to one or more locations on the top of the substrate, typically around the periphery of the substrate. However, this connection technique tends to cause unequal signal propagation delays from the global shutter trigger contact to the various pixels, and can therefore adversely affect performance of the sensor for applications requiring high-speed shuttering.

Figure 2:
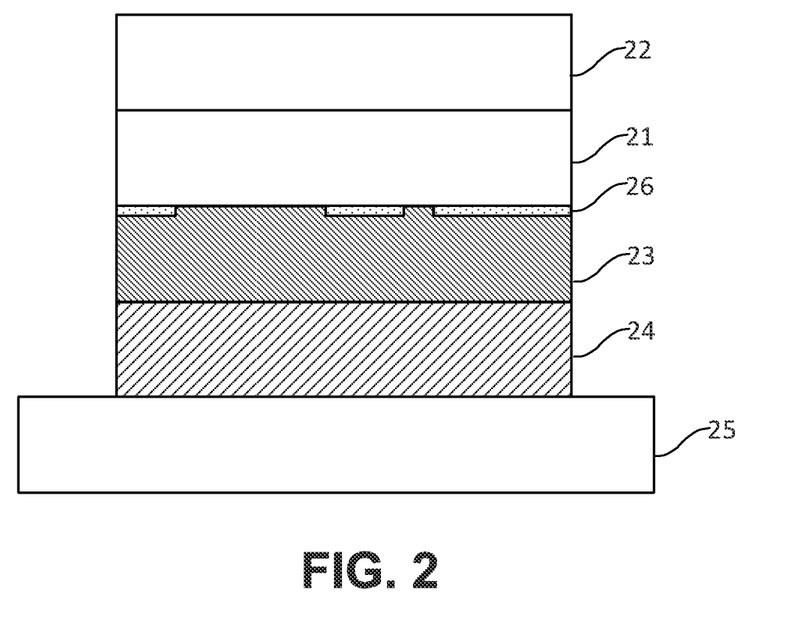
FIG. 2 shows a simplified cross-sectional view of a single pixel of a globally shuttered CCD image sensor mounted to a printed circuit board (PCB).

It may be desirable, therefore, to apply the global shutter trigger through the bottom surface of the substrate, to enable the electronic shutter to open and close uniformly across pixels. One way to accomplish this is illustrated in FIG. 2. FIG. 2 shows a simplified cross-section of a single pixel of a globally shuttered CCD image sensor mounted to a PCB. The device includes an n-doped semiconductor substrate 21 with a p-well 22 formed in it. A conductive epoxy 23 is applied to the ground and polished bottom of the substrate 21 to affix the substrate 21 to a metal pad 24 on a PCB 25. In operation, the global shutter trigger can be applied to the bottom of the substrate 21 through the metal pad 2 and conductive epoxy 23. Hence, most if not all of the bottom surface of the substrate 21 of the image sensor can be used as the global shutter trigger contact, which results in the global shutter trigger contract being uniformly close to every pixel in the sensor, thereby evening out (and reducing) the signal propagation delays of the global shutter trigger signal to the individual photodiodes (pixels).

One drawback of this approach, however, is that it may be susceptible to formation of oxidation "islands" 26 on the bottom surface of the substrate, as shown in FIG. 2, which can interfere with good electrical (low resistivity) contact, thereby leading to added parasitic capacitance and resulting in degraded shuttering. Another issue is that the conductive epoxy is in physical with the low-doped substrate, and that a Schottky diode (i.e., a metal semiconductor diode) can form, resulting in non-linear I-V characteristics and high contact resistivity. To address these problems, an approach consistent with FIGS. 3A and 3B can be used can be used. The illustrated approach includes addition to the substrate 30 of a large-area metallization 31 to form the global shuttered trigger contact, to alleviate the oxidation problem. Preferably the large-area metallization 31 that forms the global shutter trigger contact includes at least one contiguous metal layer that is substantially coextensive with the collective pixel area formed by all pixels on the sensor (more generally, the at least one contiguous metal layer can be coextensive with the collective pixel area 32 of any two or more pixels). Consequently, the distance between the global shutter trigger contact and any given photodiode is substantially equal for all photodiodes, thereby reducing variation in signal propagation delays, while also ensuring high quality (low resistivity) contact for the global shutter signal over time.

In alternative embodiments, large-area metallization 31 may be replaced with some other type(s) of conductive material or materials to accomplish essentially the same purpose, such as semi-metal and/or polysilicon. Also, in alternative embodiments metallization 31 may be replaced by two or more separate metal layers that are not contiguous along an axis parallel to the top or bottom surface of the substrate, but that are physically (electrically) coupled to each other by one or more other types of conductive layers, such as conductive epoxy, such that the metal and other conductive layers collectively form a single contiguous conductive region that is substantially coextensive with the pixel area. In some embodiments, the global shutter trigger contact may be formed by more than one, but a relatively small number (e.g., not more than 16), contiguous conductive contacts that collectively are substantially coextensive with the pixel area. In some embodiments, 80% or more of the area of the bottom or top surface of substrate is covered with the conductive region or regions that form the shutter trigger contact or contacts.

Figure 3A:
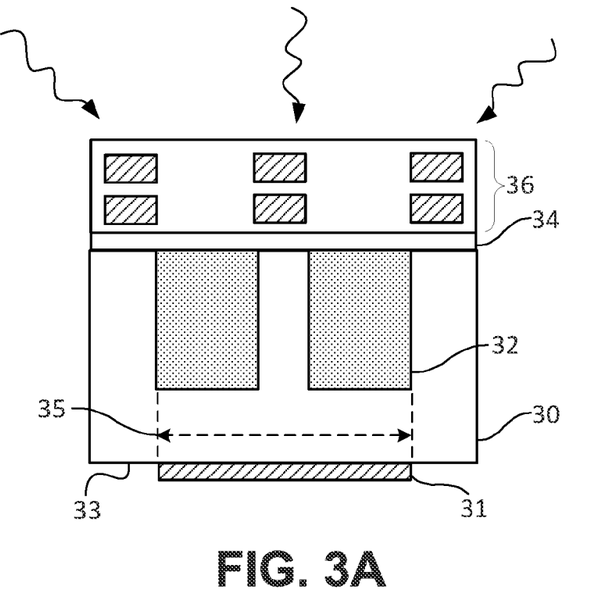
FIG. 3A shows a simplified cross-sectional view of an FSI image sensor having a large-area global shutter trigger contact on the bottom surface of the substrate.
Figure 6A:
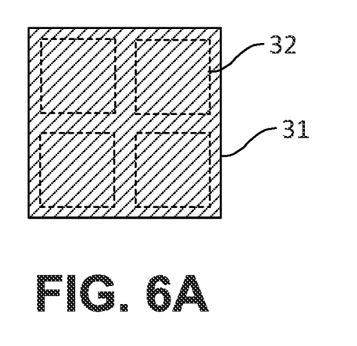
FIG. 6A shows an example of a view looking up at the bottom of the substrate of an image sensor having large-area, bottom surface shutter trigger metallization, for an FSI embodiment.

FIGS. 3A and 6A collectively show an example of how this technique can be applied in an FSI embodiment. As shown, a metallization stack 31 is applied to the bottom surface 33 of the semiconductor substrate 30 and is substantially coextensive with the pixel area 35 formed by at least two (and preferably all) of the photodiodes 32 (pixels) in the sensor. Metal routing layers 36 are formed on top of oxidation layer 34 (e.g., silicon dioxide), which is formed on the top (light-incident) surface of the substrate 30. Although in FIG. 3A the extent of the metallization stack 31 is only shown in relation to one axis (i.e., the horizontal axis of the page), the metallization stack 31 is preferably also coextensive with the collective pixel area of all pixels (all photodiodes) along a second orthogonal axis, i.e., the axis perpendicular to the page of FIG. 3A. In other words, the metallization stack 31 is preferably coextensive with the pixel area along two axes in a plane parallel to the top or bottom surface of the substrate 30, as illustrated in FIG. 6A. FIG. 6A shows a view looking up toward the bottom of the substrate 30. The outer envelope of the global shutter trigger contact 31 substantially covers (slightly overlaps) the collective pixel area of the pixels 32 (preferably all of the pixels in the device). Note that in practice a modern CCD sensor would typically include many more pixels and a more sophisticated pixel structure than shown in the picture than are shown in the figures (e.g., typically a matrix of at least 160×160 pixels). In at least some embodiments, the global shutter trigger metallization stack 31 covers substantially the entire bottom surface 33 of the substrate 30.

Figure 4:
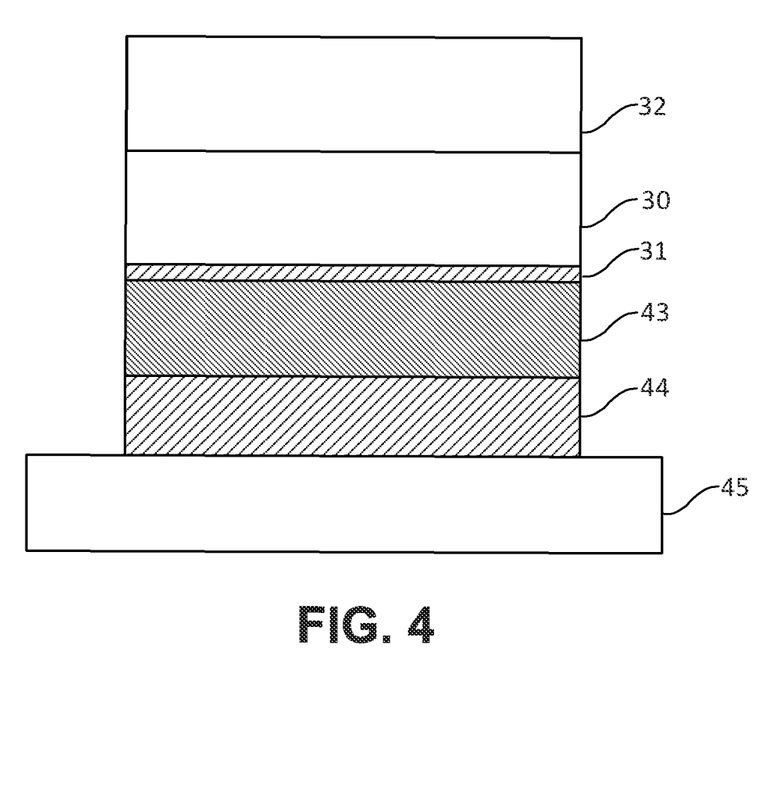
FIG. 4 shows an example of how an image sensor with bottom surface large area metallization can be mounted to a PCB.

Applying the metallization to the bottom surface of the image sensor substrate ensures a low resistivity contact over time. After the wafer is ground down to the required thickness, an oxide etch prior to metallization to remove any residual oxide may be performed, followed by the coating of the bottom side of the wafer with a suitable metallization stack. The global shutter trigger metallization stack 31 may be bonded by, for example, a layer of conductive epoxy 43 to a metal bond pad 44 on a PCB 45, as shown in FIG. 4. Alternatively, a low-temperature solder process may be used.

Figure 3B:
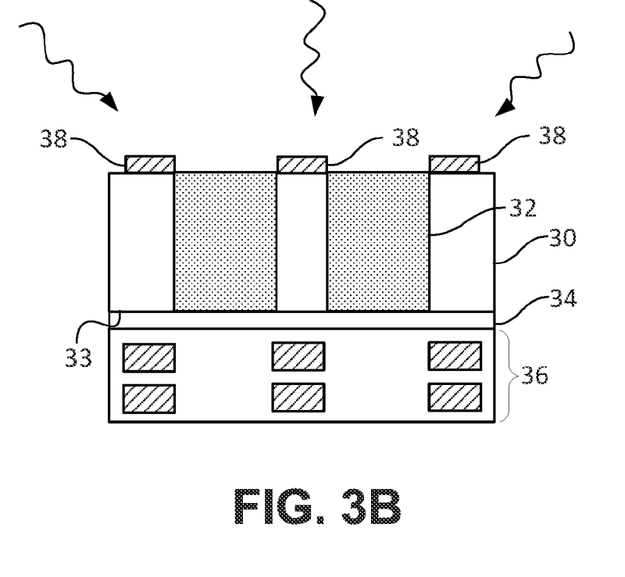
FIG. 3B shows a simplified cross-sectional view of a BSI image sensor having a large-area global shutter trigger contact on the top surface of the substrate.
Figure 6B:
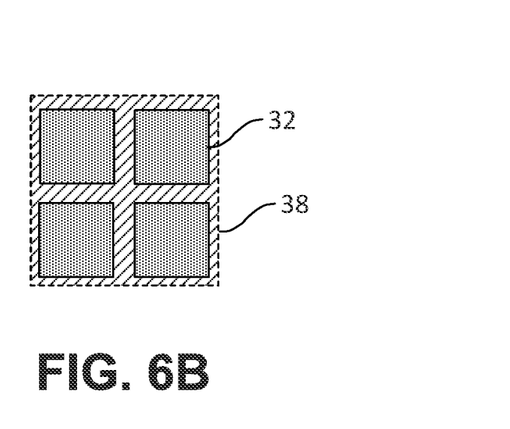
FIG. 6B shows an example of a view looking down at the top of an image sensor having top surface large-area shutter trigger metallization, for a BSI embodiment.

FIGS. 3B and 6B show an example of how a large-area global shutter trigger metallization can be included in a BSI embodiment. In the BSI embodiment, a global shutter trigger metallization stack 38 can be applied to the top surface 37 of the substrate 30 (as opposed to the bottom surface 33 in the BSI embodiment). Openings 39 can be provided in the shutter trigger metallization stack 38 to expose the photodiodes 32. Nonetheless, the shutter trigger metallization stack 38 still can be formed from at least one contiguous metal layer that is substantially coextensive with the collective pixel area of all of the pixels in the sensor (or any subset of all of the pixels). This approach is further illustrated in FIG. 6B, which shows a view looking down at the top of the sensor.

Figure 7A:
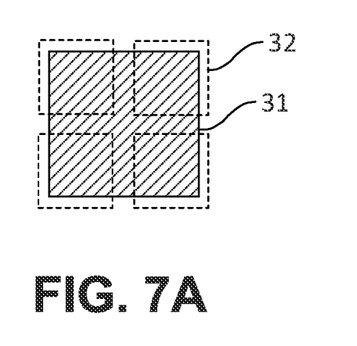
FIG. 7A shows another example of a view looking up at the bottom of the substrate of an image sensor having large-area, bottom surface shutter trigger metallization, for an FSI embodiment.
Figure 7B:
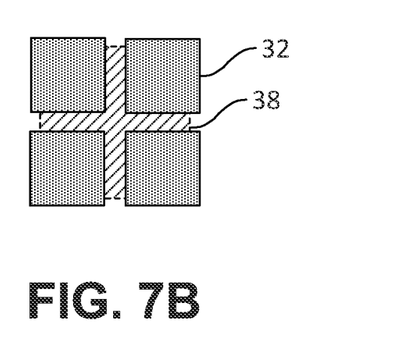
FIG. 7B shows another example of a view looking down at the top of an image sensor having top surface large-area shutter trigger metallization, for a BSI embodiment.

Note that in this description, "substantially coextensive" does not mean that the area of the two features must be quantitatively identical or almost identical. Rather, what is meant by "substantially coextensive" is that the outer envelope, or "footprint," of the shutter trigger contiguous metal layer entirely covers or nearly covers the outer envelope of the collective pixel area of the pixels (photodiodes), when viewed from an angle perpendicular to the top or bottom surface of the substrate. Hence, the outer envelope of the shutter trigger metallization area may extend beyond that of the collective pixel area of the pixels and still be considered "substantially coextensive" with the pixel area. Similarly, the other envelope of the collective pixel area of the pixels can extend slightly beyond that of the shutter trigger metallization area, as illustrated in FIGS. 7A and 7B, and still be considered substantially coextensive with the shutter trigger metallization area.

Figure 5:
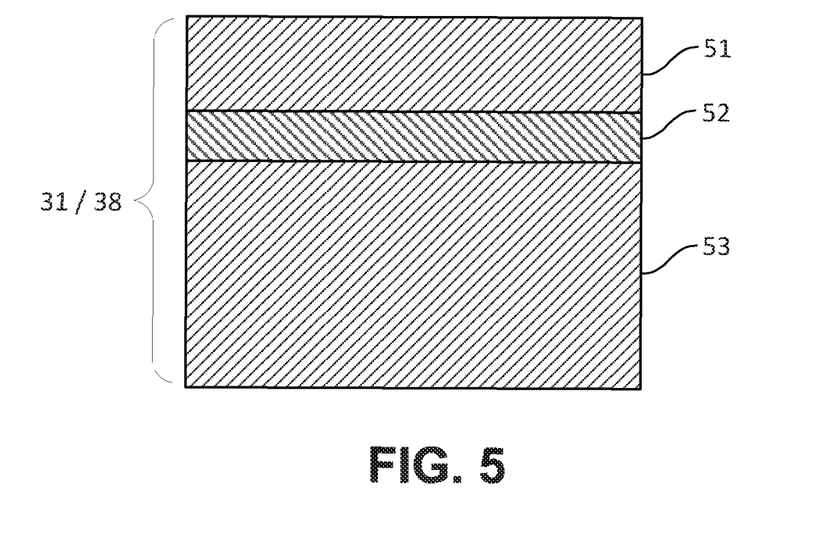
FIG. 5 illustrates an example of the metallization stack that can be used to form the global shutter trigger contact.

As shown in FIG. 5, the metallization stack 31 or 38 in certain embodiments includes at least three layers, such as: 1) an adhesion layer 51 (e.g., titanium or chromium) to ensure excellent adhesion to the backside of the silicon wafer; 2) a diffusion prevention layer 52 (e.g., platinum, tantalum or palladium) to prevent the top metal layer from diffusing into the adhesion layer or substrate; and 3) a thick metal layer 53 for low resistance (e.g., preferably less than 1 mΩ). Thick metal layer 53 may be, for example, gold if making contact with conductive glue, or nickel-and-gold or nickel-and-palladium-and-gold if making contact with solder. These metal layers can be applied by sputtering or evaporative processes, for example. Typical thicknesses of these layers may be under 0.3 μm, although as noted above, thicker or more complex layers may be used if low-temperature soldering is used instead of conductive glue, to further reduce the contact resistance.

EXAMPLES OF CERTAIN EMBODIMENTS

Certain embodiments of the technology introduced herein are summarized in the following numbered examples:

1. An image sensor comprising: a substrate including a plurality of photodetector regions, the plurality of photodetector regions collectively defining at least part of a pixel area parallel to a surface of the substrate; and a shutter trigger contact coupled to provide a common shutter trigger signal to the plurality of photodetector regions, the shutter trigger contact including a contiguous conductive region disposed on the substrate so as to be substantially coextensive with the pixel area.

2. The image sensor of example 1, wherein the contiguous conductive region is disposed on the substrate substantially coextensively with the pixel area along two orthogonal axes parallel to the surface.

3. The image sensor of example 1 or example 2, wherein the plurality of photodetector regions that collectively occupy the pixel area comprise an array of at least 25,000 pixels.

4. The image sensor of any of examples 1 to 3, wherein the contiguous conductive region covers an entirety of the pixel area defined collectively by the plurality of photodetector regions.

5. The image sensor of any of examples 1 to 3, wherein a perimeter of the contiguous conductive region is substantially coextensive with a perimeter of the pixel area, and wherein the contiguous conductive region has a plurality of openings aligned respectively with the plurality of photodetector regions.

6. The image sensor of example any of examples 1 to 5, wherein at least two of the plurality of photodetector regions, to which the shutter trigger contact is coupled, are not adjacent to each other.

7. The image sensor of any of examples 1 to 6, wherein the contiguous conductive region covers substantially all of a surface of the substrate.

8. The image sensor of any of examples 1 to 7, wherein the contiguous conductive region has openings aligned with the photodetector regions.

9. The image sensor of any of examples 1 to 8, wherein said surface is a front, light-receptive surface of the substrate, the image sensor further comprising a conductive routing layer disposed over the front, light-receptive surface to form input/output contacts for the photodetector regions; and wherein the shutter trigger contact for the plurality of photodetector regions is disposed on a back surface of the substrate.

10. The image sensor of any of examples 1 to 9, wherein the shutter trigger contact for the plurality of photodetector regions covers substantially all of the back surface of the substrate.

11. The image sensor of any of examples 1 to 10, wherein said surface is a back, light-receptive surface of the substrate, the image sensor further comprising a conductive routing layer disposed over the back, light-receptive surface to form input/output contacts for the photodetector regions; and wherein the shutter trigger contact for the plurality of photodetector regions is disposed on the back, light-receptive surface.

12. The image sensor of any of examples 1 to 11, wherein the shutter trigger contact for the plurality of photodetector regions has a plurality of openings aligned with the plurality of photodetector regions.

13. The image sensor of any of examples 1 to 12, wherein the shutter trigger contact comprises a stack that includes at least three conductive layers, the stack being formed from at least two kinds of conductive material, and wherein the stack comprises: an adhesion layer formed from a first type of conductive material and disposed on the substrate to promote adhesion of conductive material to the substrate; a low resistance metal layer; and a diffusion prevention layer formed from a second type of conductive material between the adhesion layer and the low resistance layer, to prevent diffusion into the adhesion layer.

14. An image sensor comprising: a substrate including a plurality of photodiodes including at least 25,000 photodiodes, the at least 25,000 photodiodes collectively defining at least part of a pixel area parallel to a surface of the substrate; and a shutter trigger contact coupled to provide a common shutter trigger signal to the plurality of photodiodes, the shutter trigger contact including a contiguous metal layer disposed on the substrate so that a minimum distance between the shutter trigger contact and each of the plurality of photodiodes is substantially equal.

15. The image sensor of example 14, wherein the contiguous metal layer is substantially coextensive with the pixel area.

16. The image sensor of example 14 or example 15, wherein the contiguous metal layer has a plurality of openings aligned respectively with the plurality of photodiodes.

17. The image sensor of any of examples 14 to 16, wherein the shutter trigger contact comprises a metallization stack including the contiguous metal layer and at least one other metal layer.

18. The image sensor of any of examples 14 to 17, wherein the metallization stack includes a metal a diffusion layer, a metal diffusion prevention layer and a low resistance metal layer.

19. The image sensor of any of examples 14 to 18, wherein the contiguous metal layer is disposed closest to a bottom surface of the substrate that is opposite and parallel to a light-incident surface of the substrate, and wherein the contiguous metal layer covers substantially all of the bottom surface of the substrate.

20. The image sensor of any of examples 14 to 18, wherein the contiguous metal layer is disposed closest to a light-incident surface of the substrate.

Any or all of the features and functions described above can be combined with each other, except to the extent it may be otherwise stated above or to the extent that any such embodiments may be incompatible by virtue of their function or structure, as will be apparent to persons of ordinary skill in the art. Unless contrary to physical possibility, it is envisioned that (i) the methods/steps described herein may be performed in any sequence and/or in any combination, and that (ii) the components of respective embodiments may be combined in any manner.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. An image sensor comprising:
   a substrate including a plurality of photodetector regions, the plurality of photodetector regions collectively defining at least part of a pixel area parallel to a surface of the substrate; and
   a shutter trigger contact coupled to provide a common shutter trigger signal to the plurality of photodetector regions, the shutter trigger contact including a contiguous conductive region disposed on the substrate so as to be substantially coextensive with the pixel area.

2. The image sensor of claim 1, wherein the contiguous conductive region is disposed on the substrate substantially coextensively with the pixel area along two orthogonal axes parallel to the surface.

3. The image sensor of claim 1, wherein the plurality of photodetector regions that collectively occupy the pixel area comprise an array of at least 25,000 pixels.

4. The image sensor of claim 3, wherein the contiguous conductive region covers an entirety of the pixel area defined collectively by the plurality of photodetector regions.

5. The image sensor of claim 3, wherein a perimeter of the contiguous conductive region is substantially coextensive with a perimeter of the pixel area, and wherein the contiguous conductive region has a plurality of openings aligned respectively with the plurality of photodetector regions.

6. The image sensor of claim 1, wherein at least two of the plurality of photodetector regions, to which the shutter trigger contact is coupled, are not adjacent to each other.

7. The image sensor of claim 1, wherein the contiguous conductive region covers substantially all of a surface of the substrate.

8. The image sensor of claim 1, wherein the contiguous conductive region has openings aligned with the photodetector regions.

9. The image sensor of claim 1, wherein said surface is a front, light-receptive surface of the substrate, the image sensor further comprising a conductive routing layer disposed over the front, light-receptive surface to form input/output contacts for the photodetector regions; and wherein the shutter trigger contact for the plurality of photodetector regions is disposed on a back surface of the substrate.

10. The image sensor of claim 9, wherein the shutter trigger contact for the plurality of photodetector regions covers substantially all of the back surface of the substrate.

11. The image sensor of claim 1, wherein said surface is a back, light-receptive surface of the substrate, the image sensor further comprising a conductive routing layer disposed over the back, light-receptive surface to form input/output contacts for the photodetector regions; and wherein the shutter trigger contact for the plurality of photodetector regions is disposed on the back, light-receptive surface.

12. The image sensor of claim 11, wherein the shutter trigger contact for the plurality of photodetector regions has a plurality of openings aligned with the plurality of photodetector regions.

13. The image sensor of claim 1, wherein the shutter trigger contact comprises a stack that includes at least three conductive layers, the stack being formed from at least two kinds of conductive material, and wherein the stack comprises:
   an adhesion layer formed from a first type of conductive material and disposed on the substrate to promote adhesion of conductive material to the substrate;
   a low resistance conductive layer; and
   a diffusion prevention layer formed from a second type of conductive material between the adhesion layer and the low resistance conductive layer, to prevent diffusion into the adhesion layer.

14. An image sensor comprising:
   a substrate including a plurality of photodiodes including at least 25,000 photodiodes, the at least 25,000 photodiodes collectively defining at least part of a pixel area parallel to a surface of the substrate; and
   a shutter trigger contact coupled to provide a common shutter trigger signal to the plurality of photodiodes, the shutter trigger contact including a contiguous conductive layer disposed on the substrate so that a minimum distance between the shutter trigger contact and each of the plurality of photodiodes is substantially equal.

15. The image sensor of claim 14, wherein the contiguous conductive layer is substantially coextensive with the pixel area.

16. The image sensor of claim 14, wherein the contiguous conductive layer has a plurality of openings aligned respectively with the plurality of photodiodes.

17. The image sensor of claim 14, wherein the shutter trigger contact comprises a metallization stack including the contiguous conductive layer and at least one other conductive layer.

18. The image sensor of claim 17, wherein the metallization stack includes a metal diffusion prevention layer and a low resistance metal layer.

19. The image sensor of claim 17, wherein the contiguous conductive layer is disposed closest to a bottom surface of the substrate that is opposite and parallel to a light-incident surface of the substrate, and wherein the contiguous conductive layer covers substantially all of the bottom surface of the substrate.

20. The image sensor of claim 17, wherein the contiguous conductive layer is disposed closest to a light-incident surface of the substrate.

\* \* \* \* \*